United States Patent [19]

Mollier et al.

[11] Patent Number: 4,922,135

[45] Date of Patent: May 1, 1990

[54] GAAS MESFET LOGIC CIRCUITS INCLUDING PUSH PULL OUTPUT BUFFERS

[75] Inventors: Pierre Mollier, Boissise Le Roi; Pascal Tannhof, Perthes, both of France

[73] Assignee: International Business Machines Corporation, Armonk, N.Y.

[21] Appl. No.: 271,124

[22] Filed: Nov. 14, 1988

[30] Foreign Application Priority Data

Apr. 29, 1988 [EP] European Pat. Off. ........ 88480011.1

[51] Int. Cl.[5] .......................................... H03K 19/017
[52] U.S. Cl. ................................... 307/450; 307/448; 307/475
[58] Field of Search ................. 307/443, 448, 450–451, 307/475, 494, 496–497, 270

[56] References Cited

U.S. PATENT DOCUMENTS

| 4,064,405 | 12/1977 | Cricchi et al. | 307/205 |
|---|---|---|---|
| 4,450,371 | 5/1984 | Bismarck | 307/475 |
| 4,467,455 | 8/1984 | Sood | 307/450 X |
| 4,496,856 | 1/1985 | Ransom et al. | 307/475 |
| 4,728,821 | 3/1988 | Yang et al. | 307/448 |
| 4,746,817 | 5/1988 | Banker et al. | 307/451 X |
| 4,827,159 | 5/1989 | Naganuma | 307/451 X |
| 4,831,284 | 5/1989 | Anderson et al. | 307/450 |

FOREIGN PATENT DOCUMENTS

| 215280 | 3/1987 | European Pat. Off. . |
| 237094 | 9/1987 | European Pat. Off. . |
| 249287 | 12/1987 | European Pat. Off. . |

OTHER PUBLICATIONS

"A Source Coupled FET Logic—A New Current-Mode Approach to GaAs Logics," by Shin'Ichi Katsu et al., IEEE Transactions on Electron Devices, vol. ED-32, No. 6, Jun. 1985, pp. 1114–1118.

"A CML GaAs 4Kb SRAM," by Kazukio Takahashi et al., 1985 IEEE International Solid-State Circuits Conference, Digest of Techanical Papers, pp. 68–69 (Feb. 13, 1985).

"Low Dissipation Current GaAs Prescaler IC," by K. Hasegawa et al., Electronics Letters, Feb. 27, 1986, vol. 22, No. 5, pp. 251–252.

Primary Examiner—David Hudspeth
Attorney, Agent, or Firm—Otho B. Ross, III

[57] ABSTRACT

The present invention relates to a family of new GaAs MESFET logic circuits including push pull output buffers, which exhibits very strong output driving capability and very low power consumption at fast switching speeds. A 3 way OR/NOR circuit of this invention includes a standard differential amplifier, the first branch of which is controlled by logic input signals. The second branch includes a current switch controlled by a reference voltage. The differential amplifier provides first and second output signals simultaneously and complementary each other. The circuit further includes two push pull output buffers. The first output buffer comprises an active pull up device connected in series with an active pull down device, and the first circuit output signal is available at their common node or at the output terminal. The active pull up device is controlled by a first output signal of the differential amplifier, and the active pull down device is preferably controlled by the second output signal through an intermediate source follower buffer. The second output buffer is of similar structure. The depicted circuit is of the dual phase type. However, if only one phase of the circuit output signal is needed, the output buffer and the intermediate buffer can be eliminated. The number of devices can be even further reduced by eliminating the other remaining intermediate buffer.

21 Claims, 3 Drawing Sheets

GAAS MESFET LOGIC CIRCUITS INCLUDING PUSH PULL OUTPUT BUFFERS

BACKGROUND OF THE INVENTION

The present invention relates in general to fast logic circuits, and more particularly to a family of new GaAs MESFET Source Coupled logic circuits including push pull output buffers which exhibits astonishing output driving capability and very low power consumption at fast switching speeds.

The new circuits are derived from the high speed Source Coupled FET Logic circuits (SCFL) also alternatively called Current Mode Logic circuits (CML) in the technical literature.

Examples of conventional CML/SCFL circuits are given in the following references:

Ref 1: A Source Coupled FET Logic—A New Current-Mode Approach to GaAs Logics, by Shin'Ichi Katsu et al., IEEE transactions on electron devices, Vol. ED-32, No. 6, June 1985.

Ref. 2: A CML GaAs 4Kb SRAM, by Kazukio Takahashi et al., 1985 IEEE International Solid-State Circuits Conference, Digest of technical papers, pp 68–69, (see more particularly FIG. 2).

Ref. 3: Low dissipation current GaAs prescaler IC, by K. Hasegawa et al., Electronics Letters 27th Feb. 1986 Vol. 22, No 5, pp 251-252 (see more particularly FIG. 2).

The conventional SCFL circuits are derived from the well known Emitter Coupled Logic circuits (ECL) except that the bipolar transistors are replaced with FET devices, and operate in a similar way. They are generally used in high speed applications where the output buffer circuits require large output currents. An interesting feature offered by SCFL circuits is their compatibility with ECL circuits, which allows an SCFL circuit to be directly connected to circuits manufactured using ECL technology.

FIG. 1 shows a typical dual phase SCFL circuit implementation as it may be constructed from the above cited prior art. The circuit or gate referenced 10 basically consists of a differential amplifier DA and of two source follower output buffers OB11 and OB12. The differential amplifier forms a tree comprised of two branches coupled intermediate a current source at node 11 and a first supply voltage VH at node 12. The current source is formed by FET T10, with its gate and source shorted to function as a linear load over the operating range of circuit 10, coupled to a second supply voltage VD. The first branch comprises FET T11, the gate electrode of which is connected to a reference voltage VREF, connected in series with resistor R2. The other branch comprises FET T12 connected in series with resistor R1. A logic input signal E1 is applied on the input terminal I1 of FET T12. The other end of resistors R1 and R2 is coupled to said first supply voltage VH at node 12. Circuit 10 pertains to the SCFL technology because the source regions of FETs T11 and T12 are coupled together at node 11. FETs T11 and T12 operate as current switches. First and second output signals S1 and S2 of the differential amplifier are available at nodes 13 and 14 respectively intermediate said resistors and said current switches. Said nodes 13 and 14 are respectively connected to the inputs of two source follower output buffers OB11 and OB12 mounted in parallel between third and fourth supply voltages. Usually, as represented in FIG. 1, said third supply voltage is identical to said first supply voltage and said fourth supply voltage is identical to said second supply voltage. The first source follower output buffer OB1 comprises active FET T13 loaded by resistively mounted FET T14. Generally speaking, shorted source-gate FETs are preferable to resistors. Similarly, the second source follower output buffer OB2 comprises FETs T15 and T16. Inputs of said source follower output buffers are the gate electrodes of active FETs T13 and T15. The combination of the two source-follower output buffers forms output circuit block 16.

When a logic input signal E1 is applied to the gate electrode of FET T12 in the differential amplifier, the voltage E1 is compared to the fixed reference voltage VREF applied to the gate electrode of T11, so that either FET T11 or T12 (but never both) can turn on in a current mode, depending on whether voltage E1 is higher or lower than VREF.

As explained above, the differential amplifier DA provides first and second output signals S1 and S2 respectively at node 13 and at node 14. Therefore, the gate electrode of FET T13 is driven by S1 which is the OUT OF PHASE signal, while the gate electrode of FET T15 is driven by S2 which is the IN PHASE signal. It is remarkable to notice that, both signals S1 and S2 are complementary ($S1=\overline{S2}$) and there is no skew between them. In others words, signals S1 and S2 are in perfect synchronism and simultaneity. First and second output buffer stages operate without inverting the signals, so that first and second circuit output signals A and B of circuit 10 are available in a complementary form at first and second circuit output terminals 17 and 18. These terminals are respectively at the same potential as the common nodes between FETs T13 and T14 on the one hand, and FETs T15 and T16 on the other hand. The logic function F which is performed by circuit 10 is INVERT, so that in terms of logic signals, $A=S1=\overline{E1}$ and $B=S2=E1$.

As long as a single FET T12 is used, circuit 10 operates as an inverter on one circuit output terminal. However, because logic functions F more complex than INVERT are usually required, additional transistors have to be connected to FET T12, in parallel and/or in series. For example, adding two FETs, T17 and T18 mounted in parallel with FET T12 and respectively driven by logic input signals E2 and E3, forms a logic block referenced 19 which implements a 3 Way OR/-NOR function in circuit 10.

The circuit of FIG. 1 has been shown implemented with FETs of the N type with both enhancement (E) and depletion (D) devices.

Although SCFL circuits may be designed in various fashions, combining (1) a differential amplifier structure supplying two complementary and simultaneous output logic signals (referred to as S1 and S2), and (2) a pair of source follower output buffer stages respectively driven by said output logic signals, is a common practice to all versions of SCFL circuits of the prior art (see FIG. 2 of Refs. 2 and 3, for instance).

It is also important to notice that each source follower output buffer may be understood as being comprised of an active pull up device (e.g. T13) and a passive pull down device (e.g. T14) connected in series. The latter device acts as a passive load. The active pull up devices T13 and T15 are loaded with important line capacitances (including wiring and fan-out capacitances) represented by C1 and C2 at circuit output terminals 17 and 18 respectively. Both capacitances C1 and C2 are connected to a reference potential, which in the present case is the ground potential or GND.

The usual values for capacitances C1 and C2 which are used for simulating circuit 10 are selected in the range extending from 0.1 to 4 pF.

Finally, adjusting transistor sizes and resistor values is important to fix operating voltage levels and swings. In particular, the size of FET T10 and values of resistors R1 and R2 are determining parameters in that respect. For a given standard GaAs MESFET technology, typical parameters are given below in TABLE I:

TABLE I

| Components | Parameter | Values | Units |
|---|---|---|---|
| T10 | FET size | 14.1 | μm |
| T11 | " | 34.2 | " |
| T13, T15 | " | 34.2 | " |
| T12, T17, T18 | " | 17.1 | " |
| T14, T16 | " | 14.1 | " |
| R1, R2 | Resistance | 1.7 | K-ohms |
| VD | Voltage | −0.7 | V |
| VH | " | 1.4 | " |
| VREF | " | 0.26 | " |
| C1, C1 | Capacitance | 0.1 to 4 | pF |
| E1, E2, E3 | Voltage swing | 50 to 650 | mV |

Under these conditions, the circuit of FIG. 1 is perfectly compatible with ECL logic levels, the supply voltages, levels of both input and circuit output signals being identical.

SCFL logic technology is widely used, because it provides very fast switching. It is also nearly independent of the threshold voltages of the FETs since the critical level of the transfer characteristics is equal to the externally applied reference voltage VREF. SCFL circuits are particularly attractive when metal-semiconductor FETs (MESFETs) are employed with a GaAs substrate.

When built with high enough transconductance devices, such as short channel GaAs MESFETs, SCFL circuits can provide better speed capabilities than their bipolar counterparts but they suffer from the same disadvantage of high power consumption.

The circuit of FIG. 1 dissipates big power because each source follower output buffer (e.g. OB11) essentially consists of an active pull up device loaded by a passive pull down device typically a FET (e.g. T14) operating as an equivalent resistor R. This FET has to be a big device to have a small resistance, so that in AC conditions, capacitance, e.g. C1, can discharge fast at down going transition of the signal. For similar reasons, the active pull up device, e.g. T13, is also a big device so that capacitance C1 is rapidly charged during up going transitions. Unfortunately, in the quiescent state when FET T13 is on, this low value resistance R creates a large DC sink current between VH and VD (which is negative) because FET T14 is of the depletion type. This current is not necessary. It is also to be noted that the use of the negative supply voltage VD, also causes to a slowing in the discharge capacitance C1 in AC conditions.

Most of this power consumption comes from this output sink current necessary to discharge the output capacitive loads C1 and C2 to VD.

Moreover, because the sink current is defined by a passive load (e.g. T14), the output down level exhibits a poor definition.

Finally, the circuit of FIG. 1 also suffers from its asymmetrical operation. Down going transitions measured by the fall time (Tfall) of devices are slower than up going transitions measured by the rise time (Trise). This difference comes from the sink current which is usually smaller than the transient current provided by the pull up device (e.g. T13) since its DC value is limited by the power dissipation.

To summarize, the severe drawbacks due to the usage at the circuit output of the standard source-follower buffers of the prior art are listed below:

(a) The large DC sink current necessary to pull down the capacitive loads C1 and C2 causes a large power dissipation.

(b) The DC sink current slows down the upgoing transition because it is subtracted from the current supplied by the source-follower output buffer and therefore decreases the current that charges up the loading capacitances C1 and C2.

(c) In most cases the DC sink current has to be limited to a reasonable value which is still not large enough to insure a fast turn off time when the pull up device is switched off. As a result, the down going transition is generally two to three times slower than the up going transition, thereby causing an unbalanced response of the circuit.

However, this type of circuit is still greatly desired for high speed applications not only because of its fast switching times but also because of its large tolerance to device threshold variations.

Since power dissipation is a limiting factor of paramount importance in high speed applications, circuits that have reduced power consumption are crucial to the development of advanced Ultra High Speed Integrated Circuits (UHSICs). In addition, it is also highly desirable to have circuits with symmetrical operations, say with well balanced up and down going transitions. Accordingly, there is a real need for improved output buffers obviating all these inconveniences.

OBJECTS OF THE INVENTION

It is therefore a primary object of the present invention to provide high speed FET logic circuits, typically GaAs MESFETs, with improved output buffers.

It is another object of the present invention to provide high speed FET logic circuits with reduced power dissipation even under high capacitive loading conditions.

It is another object of the present invention to provide high speed FET logic circuits with strong output driving capability.

It is another object of the present invention to provide high speed FET logic circuits with balanced down-going and up-going transitions in the circuit output signals.

It is still another object of the present invention to provide high speed FET logic circuits with a better definition of the output down level.

SUMMARY OF THE PRESENT INVENTION

These objects are achieved by the present invention. According to the basic principle of the present invention, there is taken advantage not only the fact that both polarities of the output signal are available at the outputs of the differential amplifier, but that also IN PHASE and OUT OF PHASE signals are perfectly simultaneous because they are generated by a differential amplifier like structure. The pair of standard source follower output buffers is replaced by a corresponding pair of push pull output buffers.

Each push pull output buffer comprises an active pull up device connected in series with an active pull down device. Both pull up and pull down devices are controlled by said output signals which are substantially simultaneous and complementary to each other.

As a result, replacing standard source follower output buffer stages by push pull output buffer stages drastically reduces the major part of the large DC sink current reported above, thus eliminating the corresponding DC power dissipation and in turn, restoring a good symmetry between the transitions at turn on and turn off of active pull up FETs in the push pull output buffers.

DESCRIPTION OF THE PREFERRED EMBODIMENTS

Figure 1:
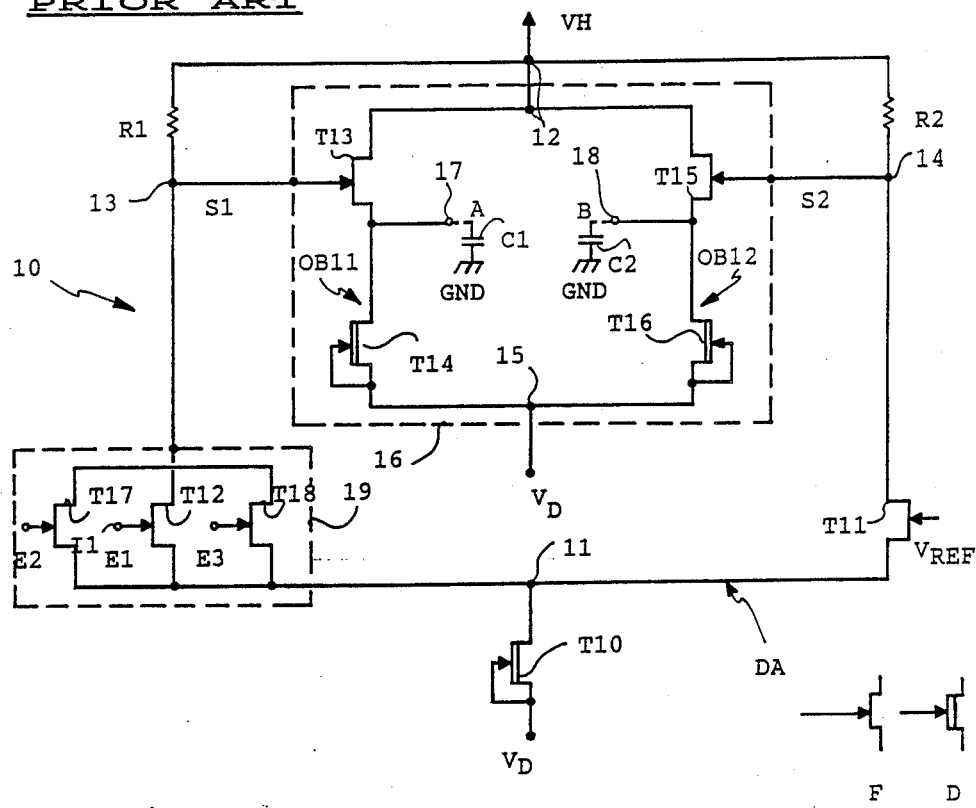
FIG. 1 is a circuit diagram of a standard dual phase OR/NOR SCFL circuit of the prior art provided with source follower output buffers.
Figure 2:
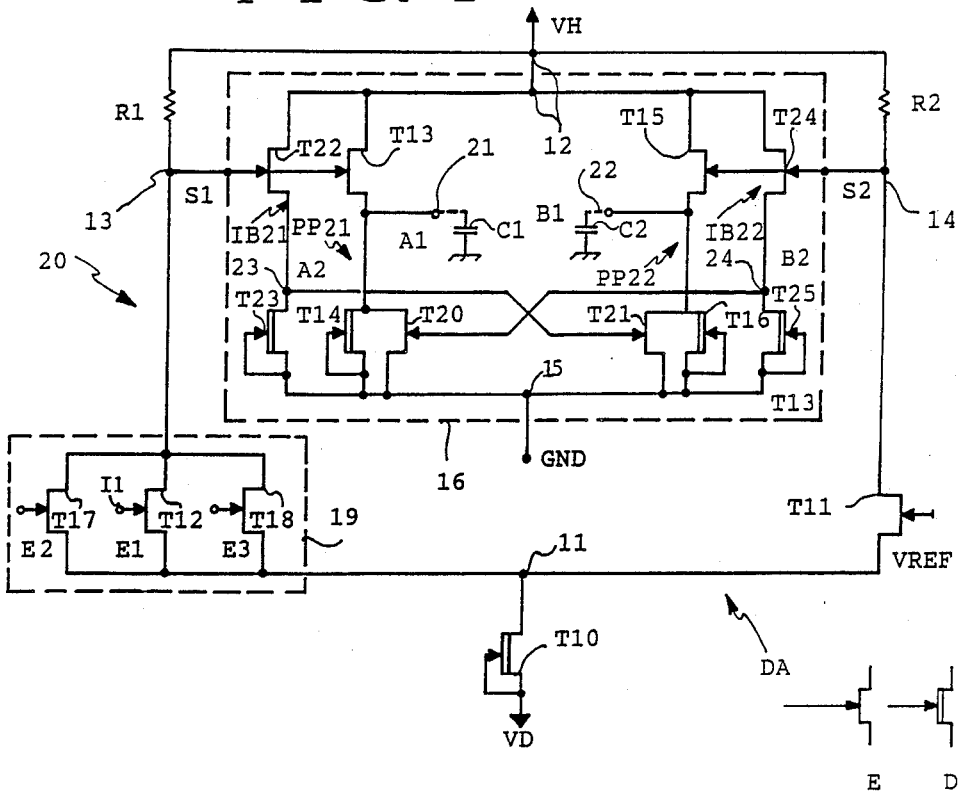
FIG. 2 is a circuit diagram of the dual phase OR/NOR SCFL circuit of the present invention with push pull output buffers.

Referring now to FIG. 2, there is given a typical implementation of a logic circuit according to the teachings of the present invention, say, including output buffers with a push pull configuration. The novel circuit referenced 20 and called a PPSCFL circuit is derived from the typical dual phase SCFL circuit 10 shown in FIG. 1. The same elements bear the same references. It must be kept in mind that output logic block 16 is coupled between third and fourth supply voltages respectively at nodes 12 and 15. In the implementation of FIG. 2, the third supply voltage is identical to said first supply voltage, say VH. Circuit 20 features the addition of new devices. New devices consist first of active pull down FETs T20 and T21 that have been added in parallel to the passive loads, respectively FETs T14 and T16, of the source-follower output buffers OB11 and OB12 of FIG. 1. It is key to the present invention that for each output buffer so modified, the control signal applied to the gate electrode of the active pull down FET be complementary and substantially simultaneous to the signal applied on the gate electrode of the corresponding active pull up FET. In other words, output buffers of circuit 20 are no longer of the source follower type but of the push pull type. First and second push pull output buffers are referenced PP21 and PP22 in FIG. 2. First and second circuit output signals A1 and B1 are available at respective output terminals 21 and 22. In the present preferred implementation, it is easy to take advantage of the fact that both polarities of the output signals of the differential amplifier, say IN PHASE and OUT OF PHASE signals, are available on the outputs of the tree that performs the logic function F. These signals are also simultaneous, with no skew therebetween. The differential amplifier like structure is therefore an excellent candidate as a logic block to supply complementary and simultaneous output signals to the push pull output buffers. Other determining logic blocks, such as latches, are also appropriate. In the first push pull output buffer PP21 the gate electrode of active pull up FET T13 is driven by first output signal S1, thus the gate electrode of active pull down FET T20 should be driven by the second output signal S2 available on the opposite side of the tree at node 14 or by a signal desired without delay and in phase with it. Symmetrical reasoning applies to pull down FET T21 in the second output buffer PP22. It is therefore important to generate the appropriate IN PHASE and OUT OF PHASE signals in terms of levels and with no noticeable delay therebetween. For example, in a first embodiment, two additional buffer stages called intermediate buffers IB21 and IB22, have been introduced between the differential amplifier output nodes 13 and 14, and the push pull output buffer stages PP21 and PP2. The first intermediate buffer stage IB1 consists of an active FET T22 loaded with a passive FET T23 connected in a source follower configuration. The second additional buffer stage comprised of FETs T24 and T25 is of similar structure. Active pull up FETs of buffers IB21 and PP21 on the one hand and IB22 and PP22 on the other hand are controlled by the same signal, respectively S1 and S2. Signals A2 and B2, respectively available at intermediate output nodes 23 and 24, are appropriate for use, because they are in phase signals with S1 and S2 respectively. Due to the source follower structure of IB21 and IB22, A2 and B2 have appropriate voltage levels and are not delayed compared to original signals S1 and S2. For example, signal B2 available at node 24 can drive the gate electrode of active pull down FET 20 of output buffer PP21, while the corresponding active pull up FET T13 is driven by S1. But the major advantage of having introduced said intermediate buffer stages is to avoid the transitions at nodes 23 and 24 from being slowed down by the capacitive loads C1 and C2 at the output terminals 21 and 22. They also have the great advantage of switching simultaneously with their paired output buffer stage, so that a real push pull effect is obtained in the latter. Dual push pull operation results from the typical cross coupling of interconnections, as is clear from FIG. 2. As another consequence, pull down devices, either of the passive type, FETs T14, T16, T23, T25 and of the active type T20 and T21 are connected to said fourth supply voltage, which is no longer the supply VD, but the potential of the ground GND. This small change has a significant impact in decreasing the power dissipation and accelerating the discharge of capacitive loads. The purpose of keeping FETs T14 and T16 in the circuit implementation is only to guarantee some current on T13 and T15 at the up level and to provide a better definition of this up level. If some degradation in performances is accepted, FETs T14 and T16 may be removed.

First and second circuit logic output signals A1 and B1, complementary to each other, are respectively available at output nodes 21 and 22.

The DC current in FETs T13 and T15 are therefore much smaller than in their counterparts of the conventional circuit shown in FIG. 1. All the transient currents necessary to pull down the output terminals 21 and 22 are supplied by devices T20 and T21. Even keeping passive FETs T14 and T16, the DC power consumption is drastically reduced.

An intermediate buffer driven by the OUT OF PHASE signal is used to supply the control signal preferably to an inverter driven by the IN PHASE signal, to supply the complementary signal. This is because an inverter would introduce undesirable extra delay. However, if heavily degraded performances are accepted, they could be used as well. In this case a differential amplifier like structure supplying two logic output signals S1 and S2, complementary each other, is no longer necessary. A determining logic block supplying a single output logic signal is appropriate.

The use of a differential amplifier like structure as a determining logic block DA is recommended in the SCFL technology to supply two logic signals simultaneous and complementary each other. However, depending on the technology used or the application involved, other logic blocks supplying complementary output signals, such as latches, could be appropriate as well. Finally, it is to be noted that implementing the present invention in any logic circuit including output buffers does not raise any difficulty, it is only necessary to have the determining logic block generating the appropriate IN PHASE and OUT OF PHASE signals for adequate push pull operation.

The dual phase PPSCFL circuit 20 of FIG. 2 still implements a 3 Way OR/NOR logic function with NFETs. The type of FETs used to implement this circuit may be easily deduced from FIG. 2.

Power supplies which provide the different supply voltages have still been chosen identical to typical values generally used in silicon bipolar ECL circuits such as explained above. However, signal levels have been adjusted in such a way that the return paths of the charging and discharging output currents are provided by devices connected either to $VH = +1.4$ V or to ground, in order to minimize power dissipation and simplify the circuit schematic as apparent from FIG. 2.

The circuit of FIG. 2 has been simulated and verified as functional. Characteristics of active and passive components, and supply voltage levels as well, which permit one to obtain the circuit of FIG. 2 according to the teaching of the present invention, are given in the following TABLE II.

TABLE II

| Components | Parameter | Values | Units |
|---|---|---|---|
| T10 | FET size | 17.4 | μm |
| T11 | " | 45 | " |
| T13, T15 | " | 45 | " |
| T12, T17, T18 | " | 22.5 | " |
| T14, T16 | " | 17.4 | " |
| T20, T21 | " | 45 | " |
| T22, T24 | " | 22.5 | " |
| T23, T24 | " | 8.7 | " |
| R1, R2 | Resistance | 1.5 | K-ohms |
| VD | Voltage | −0.7 | V |
| VH | " | 1.4 | " |
| VREF | " | 0.24 | " |
| C1, Cl | Capacitance | 0.1 to 4 | pF |
| E1, E2, E3 | Voltage swing | 50 to 650 | mV |

An up going transition in any one of the logic input signals E1, E2, E3 has two effects:

(a) a fast down going transition on nodes 13 and 23 which are lightly loaded because they are internal to circuit 20, unlike terminal 21 which is loaded by extra line capacitance C1. FET T21 is therefore quickly switched off by FET T23 connected to ground, which is of the depletion type.

(b) a fast up going transition on nodes 14 and 24, which are also lightly loaded internal nodes until the gate-source Schottky Barrier Diode of FET T15 is turned on. FET T20 is therefore quickly switched on.

The complementary effects of these two high speed signals provide very fast and strong push pull driving capability to the output terminals 21 and 22 respectively for circuit output logic signals A1 and B1, with low DC current requirements. In the circuit of FIG. 2, FETs T14, T23, T16, and T25 have significantly smaller currents than FETs T14 and T16 of circuit 10 of FIG. 1.

The same reasoning applies to down going transitions on the inputs: terminal 22 is strongly pulled down by FET T21 while terminal 21 is strongly pulled up by FET T13.

When logic input signals E1, E2, E3 are at down level, nodes 13, 21, 23 are up and nodes 14, 22, 24 are down.

Figure 3:
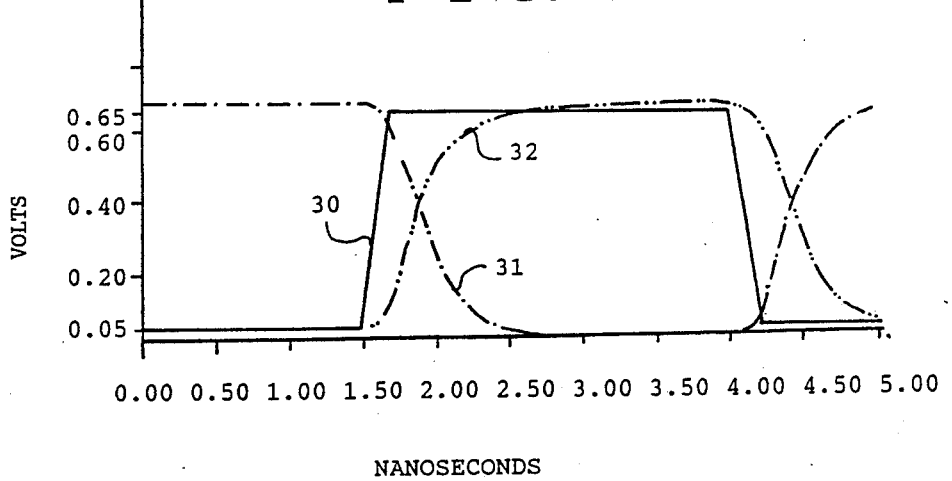
FIG. 3 shows typical waveforms obtained with the circuit of FIG. 2.

Simulated circuit operation is illustrated by FIG. 3, which shows typical waveforms of the 3 Way OR/NOR circuit or gate shown in FIG. 2, when a pulse (logic input signal E1) represented by curve 30, is applied to the gate electrode of FET T12 at time t0, while logic input signals E2 and E3 are at a low level. The potentials at output terminals 21 and 21, say the circuit output signals A1 and B1, are represented by curves 31 and 32 respectively. It is clear from FIG. 3 that circuit output signals A1 and B1 are fairly symmetric to each other with respect to a value of 0.35 V.

Figure 4:
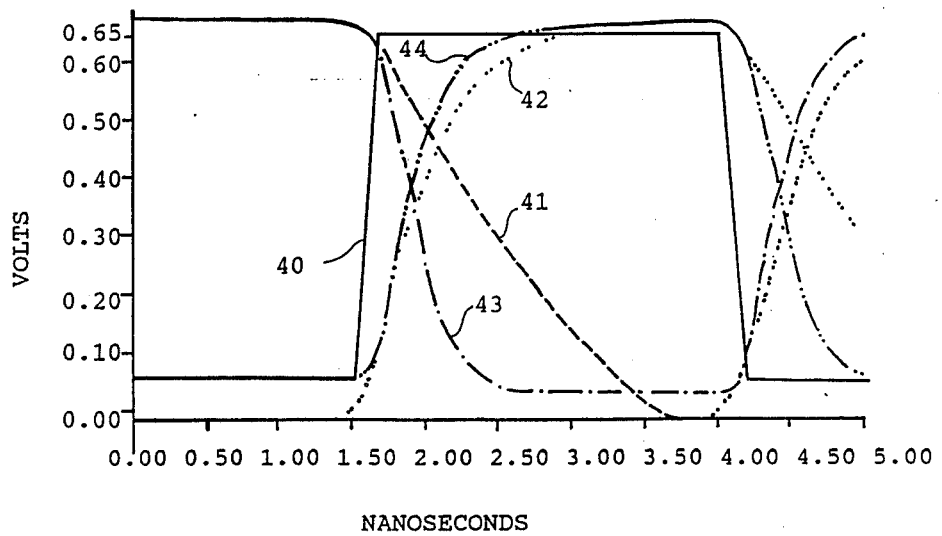
FIG. 4 shows a comparison of typical waveforms obtained with the circuits of FIGS. 1 and 2 when operating with identical capacitive loading conditions.

Output waveforms of the conventional SCFL circuit of FIG. 1 and of the dual phase Push-Pull SCFL circuit of FIG. 2, both loaded with 2 pF, are plotted in FIG. 4, to show the significant improvements in speed and symmetrization due to the push-pull configuration of the present invention.

Using the same assumptions as those in FIG. 3, a pulse is applied on the gate electrode of FET T12 while gate electrodes of FETs T17 and T18 are maintained at a low level. The logic input signal E1 is represented by curve 40. Waveforms at output nodes 16 and 17 of the conventional SCFL circuit are respectively represented by curves 41 and 42. Waveforms at output terminals 21 and 22 of the PPSCFL circuit of the present invention are represented by curves 43 and 44.

As is clear from FIG. 4, the PPSCFL circuit exhibits more abrupt and balanced up going and down going transitions when compared to the standard SCFL circuit.

Circuit 20 totally eliminates the various inconveniences of the prior art circuit referenced 10 in FIG. 1. It takes advantage of the fact that both polarities of the signal are available on the outputs of the differential amplifier at nodes 13 and 14 to perform the logic function. As a result of the push pull configuration, cross-coupling the signals, as shown in FIG. 2, allows the circuit to switch on and off the output sink currents on each output. Implementing a push pull stage, therefore, allows the reduction of the power dissipation when compared with conventional SCFL circuits and the balancing of the down-going transition with the up-going transition. In addition, it allows a better definition of the output down level since it is forced to ground by a transistor strongly turned on instead of being defined by a current through the load resistors (R1 or R2) of the differential amplifier of circuit 10 of FIG. 1.

Figure 5:
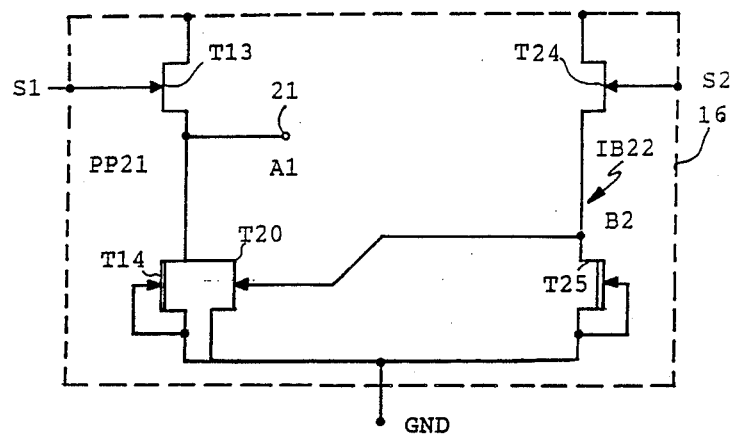
FIG. 5 is a circuit diagram of a portion of a single phase push pull SCFL gate in accordance with another embodiment of the present invention.

The number of devices required in the output logic block 16 of FIG. 2 can be reduced if only one phase of the circuit output signal is needed at one output terminal. The unnecessary devices taken out are as shown in FIG. 5. Assuming that only the circuit output signal A1 is desired, output buffer PP22 and intermediate buffer IB21 can be eliminated. Output buffer PP21 has the gate electrode of its active pull down FET T20 driven by signal B2 which is in phase with signal S2. The same reasoning applies on the other branch for circuit output signal B1.

Figure 6:
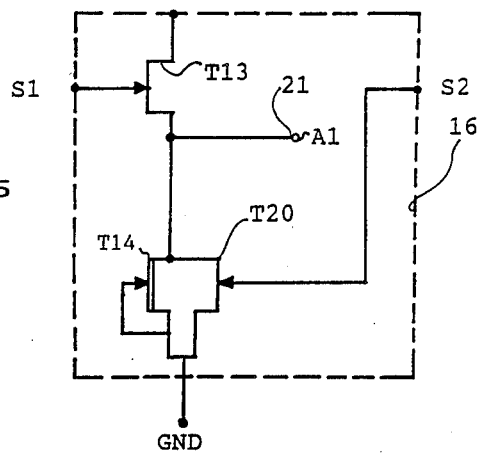
FIG. 6 is a circuit diagram of a portion of a single phase push pull SCFL gate in accordance with still another embodiment of the present invention.

More simplifications can be made to the single phase circuit of FIG. 5 in order to further reduce the number of devices and decrease the power dissipation for low to medium value capacitive loadings. FIG. 6 shows the modified circuit. The intermediate buffer stage IB22 comprised of FETs T24 and T25 is eliminated while still maintaining the adequate voltage levels on the gate electrode of T20. The same reasoning applies on the other branch for circuit output signal B1.

However the circuits of this family have some drawbacks. First, there is no longer any dotting capability. Further, one to three additional devices per output are necessary to implement the invention. In the circuit of FIG. 2, three devices T20, T22 and T23 are necessary to supply output signals A1 and A2. FETs T22 and T23 are really small devices but FET T20 may need to be large if the loading value at output terminal 21 is large, (note in that case, the power saving is even bigger).

Figure 7:
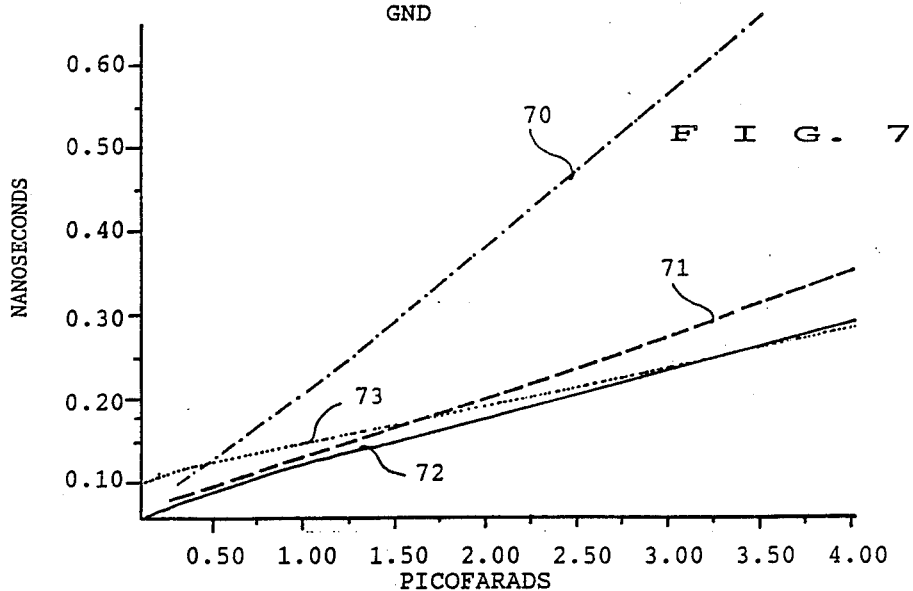
FIG. 7 shows Tfall and Trise curves respectively for the standard dual phase SCFL circuit and the single phase push pull SCFL circuit of the present invention.

Time delays (in nanoseconds versus load capacitances in picofarads ranging from 0.3 to 4 pF) are shown in FIG. 7, for the single phase push pull circuit version (of the type shown in FIG. 5) using device models corresponding to conventional Gallium Arsenide technology. Delay curves representing Tfall and Trise are respectively identified by references 70 and 71, for the conventional SCFL circuit of FIG. 1, and 72 and 73 for the single phase PPSCFL circuit of the present invention. For comparison purposes, the same device models have been used in the same technology and at same power dissipation, to characterize both the conventional SCFL and the single phase PPSCFL circuits. Simulations were made with the following conditions: Fan In=Fan Out=3 and power=6 mw. One can see that Tfall of the regular SCFL (see curve 70) is about two times longer than Trise (see curve 71), while the PPSCFL has a fall time well balanced with the fast rise time. The larger the loading the bigger the improvement. As an example, for capacitive loads larger than 1.5 pF, Trise (curve 73) and Tfall (curve 72) of the PPSCFL circuit are even better than Trise (curve 71) of the SCFL circuit. As demonstrated in FIG. 7, the improvement is by a factor of 2 or 3 for capacitive loads larger than 1.5 pF.

Finally, one must notice that the 40 ps/pF slopes of curves 72 (Tfall) and 73 (Trise) as predicted for the PPSCFL circuits are drastically better than the 200 ps/pF (Tfall) and 60 ps/pF (Trise) slopes of an advanced bipolar ECL transistor of the same power in the highest performing technologies known to date.

The basic concept of the present invention may find extensive applications in the field of Ultra High Speed Integrated Circuits (UHSICs), especially when outputs are heavily loaded, for example in OR/NOR logic gates as referred to in the present application. But the invention is not limited thereto. Other potential applications include inverting and non inverting buffers, clock distribution, off-chip drivers, line drivers, etc.

It is also to be noted that ASTAP simulations reported above were performed using GaAs technology to take full advantage of it, in terms of speed and power consumption. However, principles of the present invention can be extended to silicon FETs, provided that the device dimensions are adjusted according to the technology characteristics. The better the transconductance and cutoff frequency, the better the circuit performance.

In the present patent application FETs includes MESFETs, metal-oxide semiconductor FETs (MOSFETs), junction FETs (JFETs), modulation doped FETs (MODFETs) and any enhancement or depletion mode configurations of the same.

In addition, the circuit of FIG. 2 has been shown with N type MESFETs. Those skilled in the art will recognize that this circuit and others derived therefrom can be readily modified to employ other FETs, P type FETs and opposite power supplies. It is a popular configuration to use enhancement mode MESFETs as logic elements with depletion mode MESFETs as load elements as represented in FIG. 2. The circuits have been described in terms of positive logic but they are readily adapted to negative logic. GaAs is the preferred substrate material of the present invention, however other semiconductor materials and more particularly silicon as mentioned above, can be employed as well.

What is claimed is:

1. A high speed logic circuit with improved output driving capability and reduced power consumption, comprising:
   a determining logic block (DA) having a plurality of logic input terminals (I1, . . .) driven by corresponding input logic signals (E1, . . .) to perform a determined logical function (F); said logic block (DA) being coupled between at least first and second supply voltages (VH, VD) and supplying first and second output signals (S1, S2) complementary and substantially simultaneous to each other, at first and second output nodes (13, 14); and
   a first output buffer (PP21) coupled between third and fourth supply voltages;
   said first output buffer (PP21) including active pull up means (T13) and active pull down means (T20) connected in series and to a common node therebetween; said pull up means being driven by said first output signal (S1) and said pull down means being driven by said second output signal (S2) and through an intermediate buffer (IB22) of the source follower type coupled between said third and fourth supply voltages (PP21), to ensure a push pull operation of said first output buffer and to supply a first circuit output signal (A1) at the common node between said pull up and pull down means.

2. The logic circuit according to claim 1 wherein a passive pull down device (T14) is connected in parallel with the active pull down means (T20) of said first output buffer (PP21).

3. The logic circuit according to claim 2 wherein said determining logic block (DA) is a differential amplifier.

4. The logic circuit according to claim 3 wherein said logic circuit is implemented with N type FETs, said active pull up means consists of an enhancement N FET, and said active pull down means also consists of an enhancement N FET.

5. The logic circuit according to claim 4 wherein said passive pull down device is a resistively connected depletion N FET.

6. The logic circuit according to claim 5 wherein said logic circuit is implemented with GaAs MESFETS.

7. The logic circuit according to claim 1 further including a second output buffer (PP22) coupled between said third and fourth supply voltages and in which said second output buffer includes: active pull up means (T15) and active pull down means (T21) connected in series and to a common node therebetween, so that a second circuit output signal (B1) is available at the common node between said pull up and pull down means; said pull up means being driven by said second output signal (S2) and said pull down means being driven by said first output signal (S1) to ensure a push pull operation of said second output buffer and to supply a second circuit output signal (B1) at the common node between said pull up and pull down means of said second output buffer (PP22).

8. The logic circuit according to claim 7 wherein said pull down means (T21) of the second output buffer is driven through an intermediate buffer (IB21) of the source follower type coupled between said third and fourth supply voltages.

9. The logic circuit according to claim 8 wherein a passive pull down device (T16) is connected in parallel with the active pull down means (T21) of said second output buffer (PP21).

10. The logic circuit according to claim 9 wherein said determining logic block (DA) is a differential amplifier.

11. The logic circuit according to claim 10 wherein said logic circuit is implemented with N type FETs, said active pull up means consists of an enhancement N FET, and said active pull down means consists of an enhancement N FET.

12. The logic circuit according to claim 11 wherein said passive pull down device is a resistively connected depletion N FET.

13. The logic circuit according to claim 12 wherein said logic circuit is implemented with GaAs MESFETS.

14. The logic circuit according to claim 1, further including a second output buffer (PP22) coupled between said third and fourth supply voltages and in which said second output buffer includes: active pull up means (T15) and active pull down means (T21) connected in series and to a common node therebetween, so that a second circuit output signal (B1) is available at the common node between said pull up and pull down means; and pull up means being driven by said second output signal (S2) and said pull down means being driven by said first output signal (S1) to ensure a push pull operation of said second output buffer and to supply a second circuit output signal (B1) at the common node between said pull up and pull down means of said second output buffer (PP22).

15. The logic circuit according to claim 14 wherein said pull down means (T21) of the second output buffer is driven through an intermediate buffer (IB21) of the source follower type coupled between said third and fourth supply voltages.

16. The logic circuit according to claim 15 wherein a passive pull down device (T16) is connected in parallel with the active pull down means (T21) of said second output buffer (PP21).

17. The logic circuit according to claim 16 wherein said determining logic block (DA) is a differential amplifier.

18. The logic circuit according to claim 17 wherein said logic circuit is implemented with N type FETs, and said active pull up means consists of an enhancement N FET, and said active pull down means consists of an enhancement N FET.

19. The logic circuit according to claim 18 wherein said passive pull down device is a resistively connected depletion N FET.

20. The logic circuit according to claim 19 wherein said logic circuit is implemented with GaAs MESFETS.

21. The logic circuit according to any one of claims 7–20 wherein said first and third supply voltages are identical and positive and said fourth supply voltage is of ground potential.

* * * * *